United States Patent [19]

McKeen et al.

[11] 4,272,141
[45] Jun. 9, 1981

[54] ELECTRONIC CARD CAGE INTERFACING ASSEMBLY

[75] Inventors: Robert S. McKeen, Randallstown, Md.; Kenneth S. Keefer, Mt. Holly Springs, Pa.; Theodore E. Sawyer, Northridge, Calif.

[73] Assignee: Frederick Electronics, Frederick, Md.

[21] Appl. No.: 47,633

[22] Filed: Jun. 11, 1979

[51] Int. Cl.³ .......................... H05K 7/02; H05K 7/16
[52] U.S. Cl. .................................. 339/18 R; 361/415; 361/428
[58] Field of Search ............ 339/17 M, 17 LM, 17 N, 339/18 R, 18 B; 361/391, 394, 395, 399, 412–415, 428

[56] References Cited

U.S. PATENT DOCUMENTS

| | | | |
|---|---|---|---|
| 2,682,581 | 6/1954 | Roggenstein | 200/46 |
| 2,922,081 | 1/1960 | Dubin | 361/391 |
| 3,014,161 | 12/1961 | Tarczy-Hornoch | 361/415 |
| 3,054,078 | 9/1962 | Baschkin | 339/18 |
| 3,147,402 | 9/1964 | Hochstetler | 361/388 |
| 3,518,611 | 6/1970 | Shores, Jr. | 339/18 |
| 3,992,654 | 11/1976 | Springer et al. | 339/4 |
| 4,053,719 | 10/1977 | Debortoli et al. | 361/428 |
| 4,056,300 | 11/1977 | Schumacher | 339/221 M |
| 4,092,700 | 5/1978 | DeLuca | 361/428 |

FOREIGN PATENT DOCUMENTS 583499 12/1976 Switzerland .............................. 361/415
943804 12/1963 United Kingdom ..................... 361/415

Primary Examiner—Neil Abrams
Attorney, Agent, or Firm—Arnold, White & Durkee

[57] ABSTRACT

A modular interfacing assembly for providing termination connections between customer termination leads and input-output signal pins of a printed circuit card cage assembly is disclosed. The assembly consists of a rotatable frame having multiple interface boards mounted thereon. Each interface board provides for a certain number of terminations. A plurality of termination blocks containing termination pins suitable for attaching the customer termination leads to is mounted to the interface boards. The termination blocks, once installed onto the interface boards, cooperate with a portion of the board to provide a supporting channel for the customer termination leads. Also, contained on the interface boards are any special interface circuits, such as balancing resistors, that are required between the customer termination units and the input-output signal sources. Interconnecting each interface boards to the input-output signal pins is a set of interconnect cables which consist of a plug-connector arrangement at the interface boards. These cables contain the appropriate wire size and type for making the electrical connections to the input-output pins at the interconnect cable end opposite the end having the plug.

11 Claims, 3 Drawing Figures

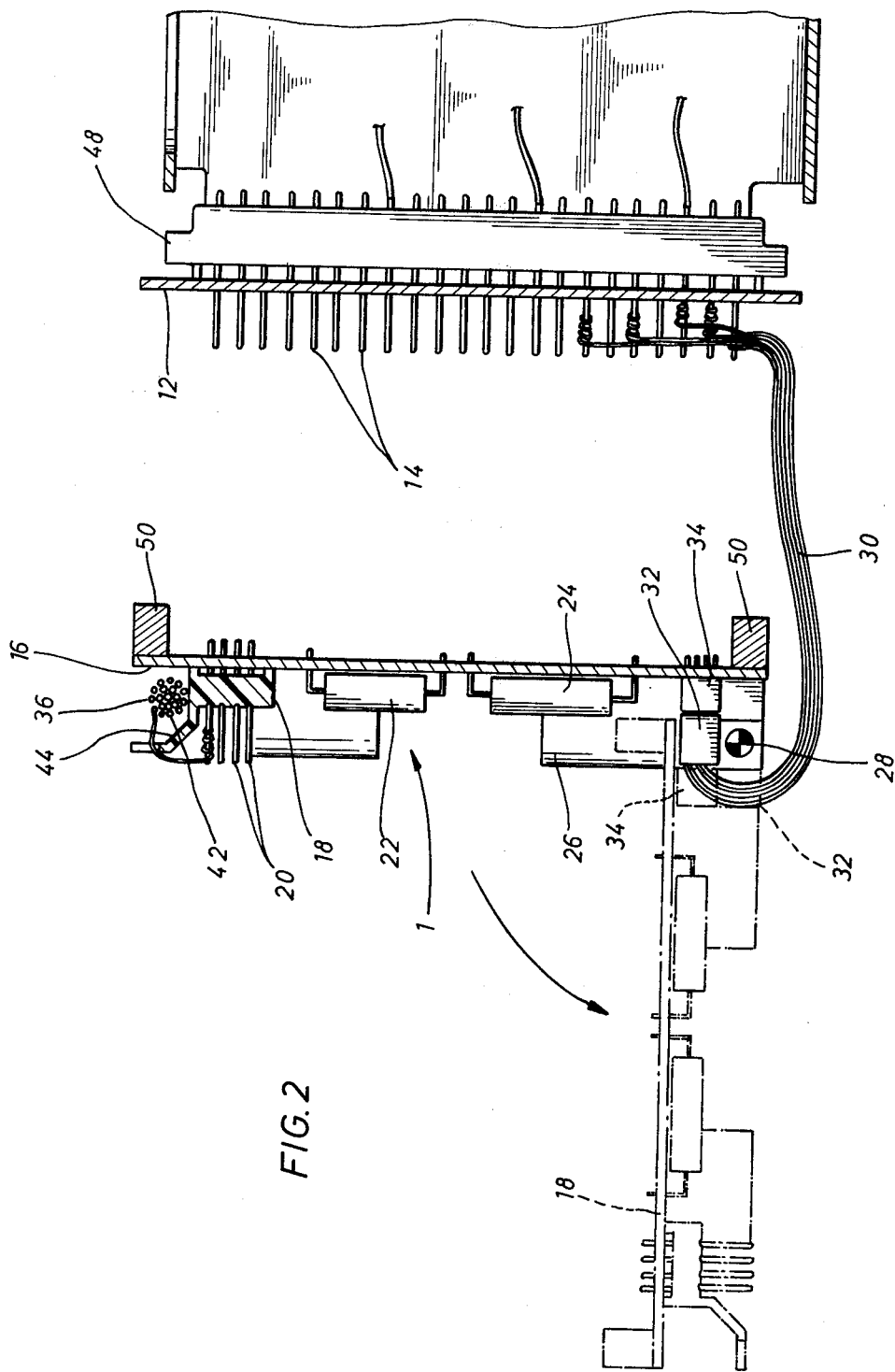

ELECTRONIC CARD CAGE INTERFACING ASSEMBLY

BACKGROUND OF THE INVENTION

This invention relates to electronic printed circuit card cage assemblies, and more particularly, it relates to a modularized electronic card cage interfacing assembly for use in a telex switching system for interfacing the electrical connections between customer termination leads and the input-output pins of the printed circuit card edge connectors.

In electronic systems which use printed circuit boards to contain the various electrical components and to interconnect them to achieve the desired functions, there is often a need to make electrical connections between the card edge connector input-output pins, which provide the electrical connections between the circuits on the printed circuit card and the rest of the system, and an external device (customer termination). The wires used in the interconnections between the various printed circuit card edge connector pins contained in the electronic card cage assembly are selected to be compatible with the particular type of pins the card edge connectors have, such as wire-wrap pins. That is, if a wire-wrap pin is provided on the card edge connector, the appropriate sized solid interconnect wire will be used to make the electrical interconnections. However, the customer termination wires may range in types from multiple conductor (stranded) wire of varying conductor sizes to single conductor (solid) wire of similar sizes, and these wires must be connected to the input-output pins of the card edge connectors, a connection in which the wire sizes may not be compatible to the pin sizes. For example, a size 20 gauge stranded wire cannot easily be connected to a 0.025 square inch wire-wrap pin which usually requires a 30 gauge solid wire.

Accordingly, making these customer termination lead connections to the backplane pins of the card edge connectors is a difficult problem. For example, the larger gauge stranded wires cannot be wire-wrapped to a wire-wrap post. For best results, they should be soldered. The bulkier wires produce solder joints on the connection pins that can result in shorts between adjacent wire-wrap posts if care is not taken to insulate the connection. Additionally, changes in termination connections are difficult to make when the termination lead has been soldered to a wire-wrap post. Soldering a stranded wire to a wire-wrapped post usually results in the lower wire-wrapped interconnection leads between the various card edge connectors becoming soldered to the post. This in effect makes those connections permanent, and if a change is needed, it is difficult to remove them.

A further problem in making the special customer termination connections to the input-output pins of the card edge connectors results from the need to have special purpose interface circuits, such as loading resistors, RC filters, capacitors, etc., inserted in the customer termination leads. These circuits may be required by such things as a need to match the source impedance to the load impedance, whether the source is in the card cage or is in the customer's equipment. And is often the case, there is no convenient place available for providing these circuits.

An additional problem presents itself in providing a means to support the wire bundle created from the customer termination leads as the leads are distributed to the various input-output pins of the card edge connectors. These termination leads need to be supported so that the weight of the wires does not pull at the electrical connection between the lead and the pin.

Therefore, it would be desirable to provide a way to interface the special customer termination leads to the input-output pins of the printed circuit card edge connector pins, such as through soldering to insure a strong and electrically sound termination connection, regardless of the type or size of termination wire used, or of the type or size of the card edge connector pins used. The interfacing assembly should provide a way to support the customer termination leads so that the weight of the bundle of wires will not damage the termination connections. Further, the interfacing assembly should provide an easy way to make changes in the termination connections as the customer requirements change, and to make these changes, the customer termination connections as well as the input-output pin connections should be accessible from the rear of the card edge connector assembly. In addition to the foregoing considerations, the interfacing assembly should be modular in construction so that if a full interface assembly is not required, less than a full unit can be provided, and as the customer requirements change, it can be expanded. Also, if there is damage to part of the assembly, the damaged part can be easily changed without having to replace the entire assembly.

SUMMARY OF THE INVENTION

In accordance with this invention, a modularized interfacing assembly for providing the electrical connections between customer termination leads and the input-output signal points of a printed circuit card cage is provided. The interfacing assembly includes a mounting frame that is positioned to the rear of the card cage and is rotatable from a first position in which the termination lead connections on the interface assembly are accessible from the rear of the card cage to a second position in which the card cage input-output points are then accessible. Contained on the mounting frame are the modular interface boards that rotate with the frame. These interface boards contain the special electrical circuits, if any, that are required between the customer termination units and the input-output signal points.

Contained on each of the interface boards is a set of termination blocks constructed of a non-conductive material, and having a plurality of electrical connection pins extending through and secured by the block. One end of the electrical connection pins also extend through the interface boards when the termination block is mounted thereon. The termination pins are connected to the electrical circuits on the board. Also mounted to the interface board is a set of multi-pinned connectors that provide a quick disconnectible input-output connection port between the circuits on the interface board and the input-output signal points of the card cage. Connecting the interface boards to the input-output pins of the card cage is a set of electrical interconnect cables, one cable for each connector. One end of each interconnect cable contains a plug adapted for connection to the multi-pin connector, while the other end is connectable to the input-output pins of the card cage.

The non-conductive material which comprises the base of the termination block contains a flange located to one end of the base and extending outwardly therefrom to define a supportive surface such that when the connection pins of the termination block are mounted in the interface board, the supportive surface and the interface board define a supporting channel in which the customer termination leads are supported. The flange contains openings through which the termination leads are distributed to the connection pins in the termination block.

BRIEF DESCRIPTION OF THE DRAWINGS

For a fuller understanding of the nature and objects of the invention, reference should be had to the following detailed description taken in connection with the accompanying drawings, in which:

FIG. 2 is a cut-away side view of the electronic card cage as viewed through the plane A—A as shown in FIG. 1;

Similar reference characters refer to similar parts throughout the several views of the drawings.

DETAILED DESCRIPTION OF THE PREFERRED EMBODIMENT

Figure 1:
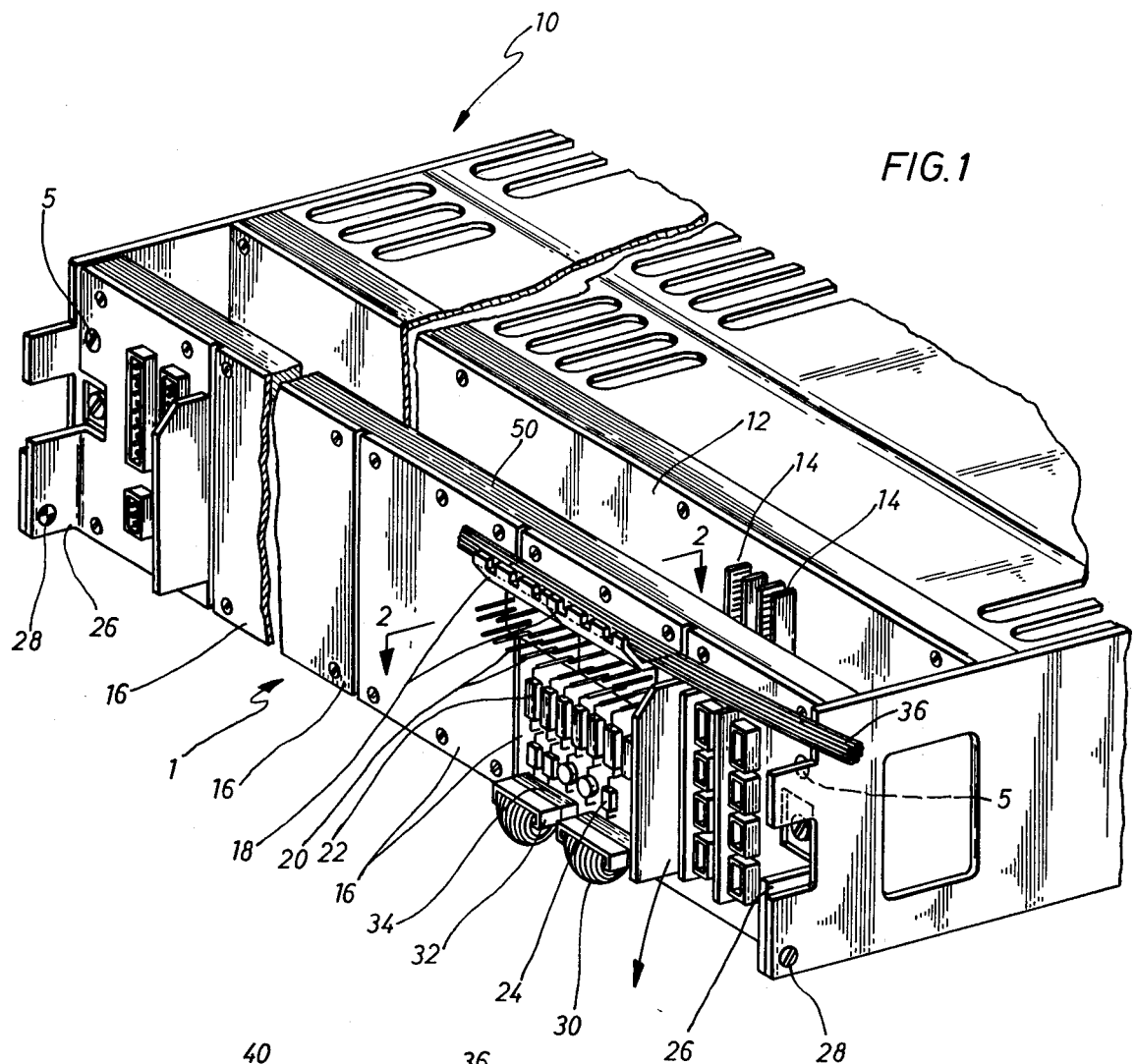
FIG. 1 is an isometric view of an electronic card cage assembly including the interfacing assembly of the present invention.

Referring to the drawings and first to FIG. 1, a typical electronic card cage assembly 10 in which printed circuit cards are supported and guided into connection with a set of card edge connectors 48 (see FIG. 2) positioned at the rear of the card cage assembly 10 is shown. It is through the pins 14 of the card edge connectors 48 that the input-output signal points for the printed circuit card are made available for interconnections to the remainder of the system. Positioned to the rear of the card edge connectors 48 is the interfacing assembly 1 which provides the termination connection points for the customer termination leads that are illustrated in FIG. 1 as a single bundle of conductors 36. The interfacing assembly 1 is composed of a set of interfacing boards 16 that are mounted to a mounting frame 50.

The interfacing assembly 1 is connected to the side panels of the electronic card cage assembly 10 by quick disconnect latches 5 located to each side of the assembly, and by a set of pivoting flanges 26 located to the bottom on each side of the mounting frame. As long as the quick disconnect latches 5 are engaged, the interfacing assembly 1 is maintained in a rigid relationship to the rear of the electronic card cage 10. By disconnecting latches 5, the interfacing assembly 1 is then free to rotate about the pivot pins 28 contained on the side panels of the card cage assembly 10. The interface assembly 1 rotates down and away from the card cage 10 (see FIG. 2).

Still referring to FIG. 2, contained on each of the interface boards that comprise the interfacing assembly 1 is a set of termination blocks 18; the special interface circuits needed between the customer termination leads and the input-output signals points of the card edge connector pins 14; and a set of multi-pin connectors 34 whose pins are connected to the circuits contained on the interface board 16. The connectors 34 provide a quick disconnectable input-output connection port between the circuits contained on the interface board 16 and the card edge connectors 48 input-output pins 14. An interface cable 30, containing the appropriate size and type wires for making terminations on the card edge connector pins 14, is provided at one end with a plug 32 that is adapted to connect to a corresponding one of the multipinned connectors 34 mounted on the interface boards 16. The interface boards 16 will typically be constructed from materials appropriate for printed circuit boards.

Referring now to FIG. 2, a cutaway side view of the interface assembly 1 and the card edge connectors 48 of the card cage assembly 10 is shown. A typical card edge connector 48 is shown mounted to a backplane motherboard 12 in which the input-output pins 14 of the card edge connector 48 are shown extending through the mother-board. The printed circuit card is supported and guided into the card edge connector by the card guides which are part of the top and bottom panels of the card case assembly 10. The interfacing assembly 1 functions to electrically make the customer termination to the appropriate input-output pin 14 of the card cage assembly in the following manner: The termination lead is positioned in the termination block supporting channel 44, and at the appropriate place, the termination lead is passed through an opening 42 in the termination block 18 and terminated on one of the connection pins 20 contained in the termination block 18. Connected to the opposite end of this connection pin 20 is a circuit lead on the interface board to either directly one of the pins of the multi-pin connector 34 or to one of the interface circuit components, such as resistor 24, positioned on the interface board 16.

Regardless of which case it is, a circuit connection is completed from the connection pin 20 to one of the pins of the connector 34. From this connector 34, the electrical connection is continued through plug 32 and cable 30 to the backplane of the card cage assembly 10. The wire contained in the interconnect cable 30 that is connected to the pin of connector 34 that in turn is connected to the termination pin 20 for the subject termination lead is then routed and connected to the appropriate input-output pin 14 of card edge connector 48. In this manner, the interface assembly 1 provides a supporting means for the customer termination leads and a secure connecting point for the lead prior to its termination onto the desired input-output pins 14 of the card edge connector 48.

There are times when it is necessary that customer terminations be changed. This, in turn, may require that the termination connections on the input-output pins 14 also be changed. The interfacing assembly 1 functions to accommodate both requirements. That is, when access to the customer terminations are required, those terminations are readily accessible to the rear of the electronic card cage assembly 10. When access to the input-output pins 14 of the card edge connectors 48 is required, the interfacing assembly 1 may be disconnected from the side panels of the card cage assembly by disengaging latches 5 and rotated downwardly and away from the card cage assembly 10. In this way, access is gained to the desired input-output pins 14.

Should an interface board 16 become damaged or otherwise need to be replaced, the customer terminations on the termination blocks for that interface board and the interconnecting cables 30 connected to this interface board can be disconnected to permit the removal of that particular interface board. The removed board may then be repaired, or a new one inserted in its place and the connections re-made. In this manner, repairs to the interfacing assembly may be made without having to completely remove the entire interfacing assembly 1. Also, by disconnecting all the interconnect cables, the entire card cage can be removed from the cabinet without having to disconnect the customer terminations to the interface assembly.

Figure 3:
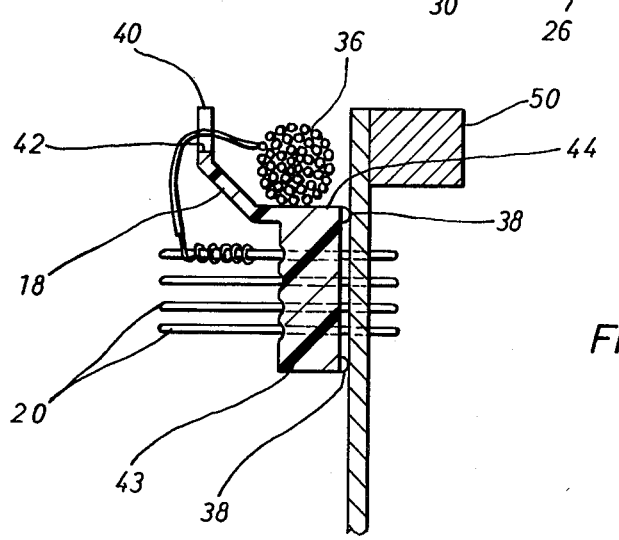
FIG. 3 is a side view of the termination block as mounted in the interface board.

Referring now to FIG. 3, a partial cutaway side view of the interfacing board 16 containing the termination block 18 is shown. The customer termination cable 36 is shown positioned in a supporting channel 44 formed from a flange 40, extending from one end of the termination block, and from a portion of the front surface of the interface board 16 when the termination block 18 is mounted in the board. The termination leads from the bundle 36 are fed through a series of notches or openings 42 contained in the flange 40 and distributed to the various terminations pins 20 of the termination block 18. These terminations may be soldered, but other appropriate means of connections are available, such as a crimped connection, wire-wrap, etc. The base 13 of termination block 18 contains stand off elements 38 at each end of the base to provide a stand-off means between the interface board 16 and the termination block 18. The interconnect pins 20 are passed through the base 43 of the termination block 18 and are secured therein so that when one end of the termination pins 20 are passed through the interface board 16 and soldered, the termination block 18 will be rigidly attached to the interface board 16.

In summary, the interfacing assembly 1 provides a reliable and convenient means for interfacing customer termination leads to the appropriate input-output signal points of the printed circuit cards in a card cage assembly. Additionally, special circuits components, such as fuses, resistors, capacitors can conveniently be inserted between these connections. Because the interface assembly is modular in construction and is provided with disconnectable interconnect cables 30, the card cage assembly 10 can be removed without in any way affecting the customer wiring; the entire interface assembly 1 can be removed without affecting the card cage assembly (terminator tray); and each individual interface board having a fixed number of customer terminations thereon can be removed without disturbing the other terminations.

In describing the invention, reference has been made to its preferred embodiment. However, those skilled in the art and familiar with the disclosure of the invention may recognize additions, deletions, substitutions, or other modifications which would fall within the pervue of the invention as defined in the appended claims.

What is claimed is:

1. A modularized interfacing assembly for providing electrical connections between external customer termination leads and internal input-output signal points of an electronic card cage, said assembly comprising:
   (a) a mounting frame rotatable with respect to the card cage;
   (b) at least one interface board mounted to said frame for rotation therewith, said board having electrical circuits thereon;
   (c) at least one termination block mounted on each interface board, for electrically connecting the termination leads to the electrical circuits on said board;
   (d) at least one multi-pinned connector mounted on each interface board, for providing a quick disconnectable input-output connection port between the circuits on said board and the input-output signal points of the card cage, the pins of said connector connected to the electrical circuits on said board; and
   (e) at least one electrical interconnect cable, for providing the electrical connections between said interface boards and the card cage, each said cable having one end adapted for plugging into said connector and the other end connectable to the input-output signal points of the card cage.

2. The interfacing assembly in accordance with claim 1 wherein said termination block comprises:
   (a) an electrical non-conductive member; and
   (b) a plurality of electrical connection pins extending through and secured by said member, said pins appropriately positioned in said member for mounting on said interface board such that when said pins are mounted in said interface board, a portion of said member cooperates with said board to define a supporting channel for the termination leads.

3. The interfacing assembly in accordance with claim 2 wherein said electrical non-conductive member comprises:
   (a) a substantially planar base having said connection pins mounted therein, said pins extending through said base;
   (b) standoff elements connected to said base for holding off said base from said interface board when said connection pins are mounted in said board; and
   (c) a flange extending from said base, said flange having a supportive surface such that when said connection pins are mounted in said board, the surface and said board define the supporting channel.

4. The interfacing assembly in accordance with claim 3 wherein said flange contains openings through which the termination leads are distributed to said connection pins.

5. The interfacing assembly in accordance with claim 1 wherein said mounting frame is rotatable from a first position in which said termination lead connections are accessible from the rear of the card cage to a second position in which said card cage input-output points are accessible.

6. An electrical lead terminating device for use with electrical back plane boards having printed circuit card edge connections mounted therein to provide interface connections between termination leads from points external to the back plane and the connector pins of the card edge connectors, said device comprising:
   (a) an electrical non-conductive member; and
   (b) a plurality of electrical connection pins extending through and secured by said member, said pins appropriately positioned in said member for mounting on said back plane board such that when said pins are mounted in said board, a portion of said member cooperates with said board to define a supporting channel for supporting the weight of the termination leads, and for distributing the termination leads to said connection pins, said non-conductive member having,
      (i) a substantially planar base containing said connection pins,
      (ii) standoff means connected to said base for holding off said base from said board when said pins are mounted in said board, and
      (iii) a flange located to one end of said base and extending outwardly therefrom, said flange having a supportive surface such that when said pins are mounted in said board, the surface and said board define the supporting channel.

7. The device in accordance with claim 6 wherein said flange contains openings through which the termination leads are distributed to said pins.

8. In a printed-circuit card cage assembly having,
(a) a plurality of card cage connectors, said connectors containing input-output signal pins,
(b) support means for supporting and guiding printed circuit cards into contact with said edge connectors,
(c) means for mounting said support means in a cabinet; and
(d) means for connecting customer termination signal leads from points external to the card cage to said input-output signal pins, the improvement in the card cage assembly includes an improved connecting means comprising:
(A) a mounting frame positionable in said cabinet to the rear of said support means, said frame rotatable in respect to said support means;
(B) at least one interface board mounted to said frame for rotation therewith, said board having electrical circuits thereon;
(C) at least one termination block mounted on each interface board, for electrically connecting the customer termination signal leads to the electrical circuits on said board;
(D) connector means mounted on each said interface board, for providing a disconnectable input-output connection port between the circuits on said board and the input-output signal pins of said card edge connectors; and
(E) at least one electrical cable, for providing electrical connections between said connector means and the card edge connector pins to thereby complete the electrical connection between the termination signal leads and the input-output signal pins.

9. The improved card cage assembly of claim 8 wherein said mounting frame rotates from a first position in which the customer termination signal lead connections to said interface boards are accessible from the rear of the assembly to a second position in which the card edge connector pin connections are accessible.

10. The improved card cage assembly of claim 8 wherein said termination block comprises:
(a) a substantially planar base;
(b) a plurality of electrical termination pins extending through and secured by said base;
(c) standoff means for holding off said base from said interface board when said termination pins are mounted in said interface board; and
(d) a flange located to one end of said base and extending outwardly therefrom, said flange having a supportive surface such that when said termination block is mounted to said interface board, said flange and said board define a supporting channel for said customer termination leads.

11. The improved card cage assembly of claim 10 wherein said flange contains openings therein through which said customer termination leads are distributed to said termination pins.

* * * * *